US010393550B2

(12) United States Patent
Kudo et al.

(10) Patent No.: US 10,393,550 B2
(45) Date of Patent: Aug. 27, 2019

(54) ENCODER AND APPARATUS HAVING THE SAME

(71) Applicant: CANON PRECISION INC., Hirosaki-shi (JP)

(72) Inventors: Kousuke Kudo, Hirosaki (JP); Hitoshi Nakamura, Hirosaki (JP)

(73) Assignee: CANON PRECISION INC., Aomori-Ken (JP)

( * ) Notice: Subject to any disclaimer, the term of this patent is extended or adjusted under 35 U.S.C. 154(b) by 65 days.

(21) Appl. No.: 15/689,904

(22) Filed: Aug. 29, 2017

(65) Prior Publication Data

US 2018/0058885 A1  Mar. 1, 2018

(30) Foreign Application Priority Data

Aug. 30, 2016 (JP) .................. 2016-167775

(51) Int. Cl.
*G01D 5/347* (2006.01)
*G01D 5/245* (2006.01)
*H03M 1/00* (2006.01)

(52) U.S. Cl.
CPC ....... *G01D 5/34715* (2013.01); *G01D 5/2454* (2013.01); *G01D 5/34776* (2013.01); *G01D 5/34792* (2013.01); *H03M 1/001* (2013.01)

(58) Field of Classification Search
CPC ............ G01D 5/32; G01D 5/34; G01D 5/342; G01D 5/347; G01D 5/34707; G01D 5/34715; G01D 5/34723; G01D 5/36; G01D 5/38; G01D 5/54; G01D 5/58; G01D 5/34746; G01D 5/34753; G01D 5/2454; G01D 5/2451; G01D 5/2455; G01D 5/2457; G01D 5/2458; G01D 5/34776; G01D 5/34784; G01D 5/34792; H03M 1/001

See application file for complete search history.

(56) References Cited

U.S. PATENT DOCUMENTS

| 5,235,181 | A | * | 8/1993 | Durana | G01D 5/36 250/231.14 |
| 5,563,408 | A | * | 10/1996 | Matsumoto | G01D 5/2455 250/231.14 |
| 6,842,602 | B2 | * | 1/2005 | Kudo | G03G 15/757 347/116 |
| 7,663,093 | B2 | * | 2/2010 | Kusano | G01D 5/2455 250/231.13 |

(Continued)

FOREIGN PATENT DOCUMENTS

| EP | 2581713 A2 | 4/2013 |
| JP | 2013-88191 A | 5/2013 |

OTHER PUBLICATIONS

Extended European Search Report, Application No. 17188086.7-1022, dated Jan. 31, 2018.

*Primary Examiner* — John R Lee
(74) *Attorney, Agent, or Firm* — Canon U.S.A., Inc. IP Division

(57) ABSTRACT

An encoder includes a scale, a detector, and a processor. The processor executes a second process while executing a first process, calculates a first relative position of one of the scale and the detector to the other of the scale and the detector when a calculation of a relative position between them starts, and then calculates a second relative position of the one to the other based on a relative displacement amount between them and the first relative position.

10 Claims, 11 Drawing Sheets

(56) References Cited

U.S. PATENT DOCUMENTS

| | | | |
|---|---|---|---|
| 7,943,897 B2* | 5/2011 | Okada | G01D 5/34746 |
| | | | 250/231.13 |
| 8,993,955 B2* | 3/2015 | Nakamura | G01D 5/347 |
| | | | 250/231.13 |
| 9,103,699 B2* | 8/2015 | Nakamura | G01D 5/34746 |
| 9,279,703 B2* | 3/2016 | Nakamura | G01D 5/347 |
| 9,574,910 B2* | 2/2017 | Yonezawa | G01B 11/14 |
| 10,113,888 B2* | 10/2018 | Honda | G01D 5/34776 |
| 2004/0022557 A1* | 2/2004 | Kudo | G03G 15/757 |
| | | | 399/167 |
| 2011/0147572 A1* | 6/2011 | Nakamura | G01D 5/2448 |
| | | | 250/231.16 |
| 2013/0096862 A1* | 4/2013 | Nakamura | G01D 5/347 |
| | | | 702/94 |
| 2013/0292556 A1* | 11/2013 | Nakamura | G01D 5/34776 |
| | | | 250/231.1 |
| 2013/0292557 A1* | 11/2013 | Nakamura | G01D 5/34776 |
| | | | 250/231.1 |
| 2015/0062661 A1 | 3/2015 | Asano | |
| 2015/0076332 A1* | 3/2015 | Nagura | G01B 11/14 |
| | | | 250/231.13 |
| 2015/0268068 A1 | 9/2015 | Suzuki | |
| 2018/0003524 A1* | 1/2018 | Cook | G01D 5/20 |
| 2018/0058885 A1* | 3/2018 | Kudo | G01D 5/2454 |

\* cited by examiner

ENCODER AND APPARATUS HAVING THE SAME

BACKGROUND OF THE INVENTION

Field of the Invention

The present invention relates to an encoder used for a variety of apparatuses, such as an optical apparatus, and configured to output a signal indicative of a position along with a relative movement between a scale and a sensor as a movable member moves in the apparatus.

Description of the Related Art

An encoder used to detect a position and a speed of a movable member includes a scale having a periodic pattern, and a sensor having a detector that outputs a periodic signal that periodically changes according to the periodic pattern with the relative movement to the scale. One encoder is an incremental type encoder that generates two periodic signals that has phases different from each other (a pair or set of two-phase or biphase signals) based on one periodic pattern, and detects a relative displacement between the scale and the sensor based on the number of periods and the phases in the two-phase signals. An absolute type encoder is another encoder that generates two sets of two-phase signals based on two periodic patterns having periods different from each other and detects an absolute position of the scale or sensor based on a phase difference between a phase in one set of two-phase signals and a phase in the other set of two-phase signals.

The absolute type encoder needs to read more periodic patterns than the incremental type encoder, and requires a plurality of detectors corresponding to the number of periodic patterns, causing a more complicated structure. Accordingly, an absolute type encoder can be implemented that provides the scale with a plurality of periodic patterns having periods different from one another and can restrain an increase of the number of detectors by time-sequentially switching a detecting period of the detector in the sensor or a periodic pattern to be read.

However, even this encoder also has the following problems: Just after the detecting period of the detector in the sensor is switched, it takes a time for a periodic signal (analogue signal) output from the element in the detector, such as a light receiving element and a magnetic detecting element, to become stable. Thus, a positional detection delays for each switch of the detecting period.

Japanese Patent Laid-Open No. 2013-88191 discloses an encoder that can prevent the positional detection from delaying since it is unnecessary to switch the detecting state of the detector when a first process moves to a second process.

However, the encoder disclosed in Japanese Patent Laid-Open No. 2013-88191 may cause a relative position to shift where a calculating time period for the relative position with a plurality of signals having a changing period corresponding to a periodic pattern is longer than a predetermined time period.

SUMMARY OF THE INVENTION

The present invention provides an encoder that can accurately calculate a relative position irrespective of a calculating time period.

An encoder according to one aspect of the present invention includes a scale that has a first periodic pattern and a second periodic pattern that has a period longer than that of the first periodic pattern, a detector movable relative to the scale, and switchable between a first detecting state in which the detector reads the first periodic pattern by changing a combination in a plurality of read elements and outputs a first signal having a changing period that depends on the first periodic pattern, and a second detecting state in which the detector reads the second periodic pattern and outputs a second signal having a changing period that depends on the second periodic pattern, and a processor configured to execute a first process for calculating a relative displacement amount between the scale and the detector by using one of the first signal and the second signal obtained from the detector that is set to one of the first detecting state and the second detecting state, and a second process for calculating a relative position of one of the scale and the detector relative to the other of the scale and the detector by using both of the first signal and the second signal obtained from the detector that is set to each of the first detecting state and the second detecting state. The processor executes the second process while the processor executes the first process. The processor calculates a first relative position of the one to the other when a calculation of the relative position starts, and then calculates a second relative position of the one to the other based on the relative displacement amount and the first relative position.

Further features of the present invention will become apparent from the following description of exemplary embodiments with reference to the attached drawings.

DESCRIPTION OF THE EMBODIMENTS

Figure 1A:
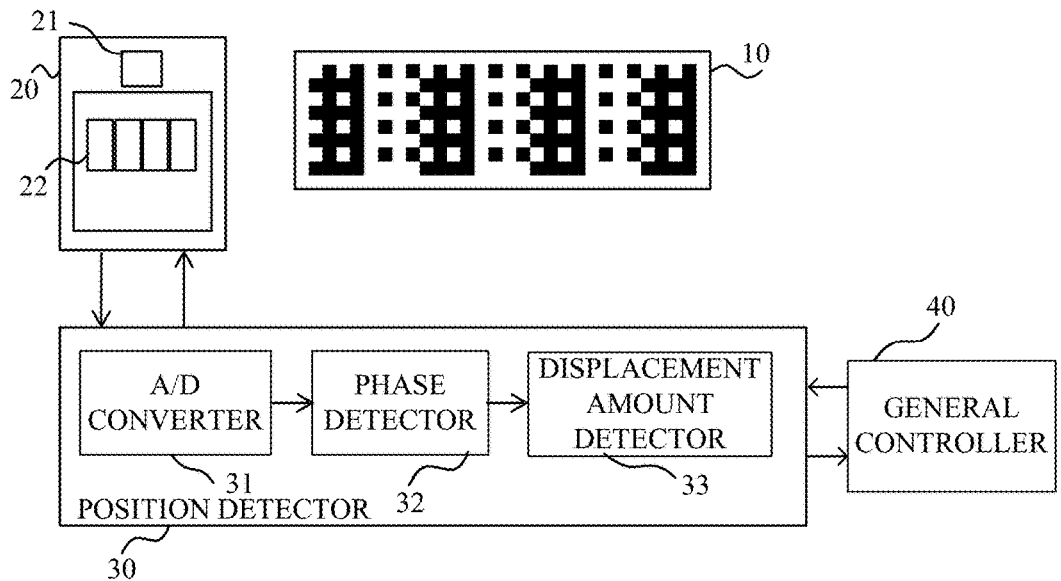
FIGS. 1A and 1B are block diagrams illustrating configurations of encoders according to a first embodiment.

Referring now to the accompanying drawings, a detailed description will be given of embodiments according to the present invention. In each figure, corresponding elements will be designated by the same reference numerals, and a duplicate description thereof will be omitted.

First Embodiment

FIG. 1A is a block diagram illustrating a configuration of an encoder 100 according to this embodiment. The encoder 100 includes a scale 10, a sensor (detector) 20, a position detector (processor) 30, and a general controller 40. The encoder 100 is an optical reflection type absolute encoder that detects a position (relative position) of one of the scale 10 and the sensor 20 to the other of the scale 10 and the sensor 20.

In this embodiment, in an apparatus mounted with this encoder, the scale 10 is attached to an unillustrated movable member as an object of the relative position to be detected, and the sensor 20 is attached to a fixed or immovable member. Alternatively, the sensor 20 may be attached to the movable member and the scale 10 may be attached to the fixed member, and the relative position of the movable member relative to the fixed member may be detected. While this embodiment discusses a linear type encoder, a rotary type encoder may be configured similar to this embodiment.

Figure 2A:
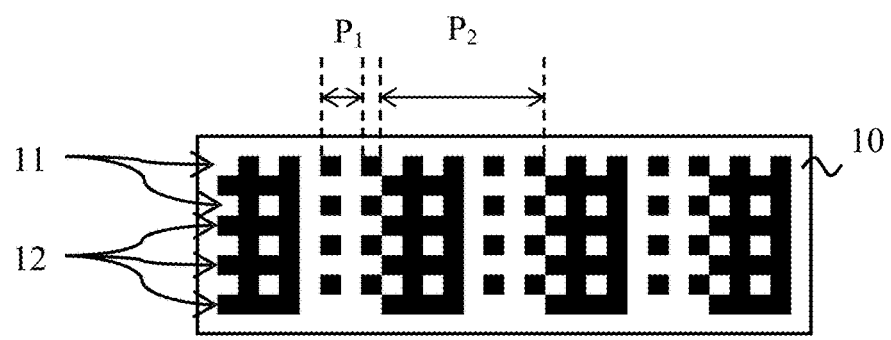
FIGS. 2A, 2B, and 2C illustrate a periodic pattern in a scale.

FIG. 2A illustrates a periodic pattern provided to the scale 10. In the following description, in a three-dimensional space, a relative moving direction between the scale 10 and the sensor 20 will be referred to as a longitudinal direction (position detecting direction), and a direction orthogonal to the longitudinal direction on a plane on which the periodic pattern is provided on the scale 10 will be referred to as a width direction. A reflecting part and a nonreflecting part are formed on the scale 10 along the longitudinal direction and alternate with a predetermined period (pitch). In this embodiment, the scale 10 has two periodic patterns (or a first periodic pattern 11 and a second periodic pattern 12) that are alternately provided in the width direction and have pitches P1 and P2 that are different from each other. In the following description, the first periodic pattern 11 will be referred to as a first pattern, and the pitch P1 will be referred to as a first pitch. The second periodic pattern 12 will be referred to as a second pattern, and the pitch P2 will be referred to as a second pitch.

The first pitch P11 is set to about ¼ as long as the second pitch P2 (or the second pattern 12 has a period longer than that of the first pitch 11). An overall length of a range (referred to as a "overall pattern length") on the scale 10 in which the first and second patterns 11 and 12 are provided in the longitudinal direction contains 79 periods of the first pattern 11 and 20 periods of the second pattern 12.

The sensor 20 includes a light source 21 and a light receiver 22. The light source 21 includes a light emitting element, such as an LED, and the light receiver includes a plurality of photoelectric conversion elements (light receiving elements) configured to photoelectrically convert light emitted from the light source 21 and reflected by the reflecting parts in the first and second patterns 11 and 12. The sensor 20 can read the first and second patterns 11 and 12 based on a detecting period switching signal from the position detector 30.

Next follows a description of switching of the detecting period. The sensor 20 can switch the detecting period of the light receiver 22 according to the detecting period switching signal from the position detector 30 between a first detecting period P0 that coincides with the first pitch P1 and a second detecting period 4·P0 that coincides with the second pitch P2. The first detecting pitch P0 and the second detecting pitch 4·P0 may have substantially the same values as those of the first and second pitches P1 and P2.

Figure 3A:
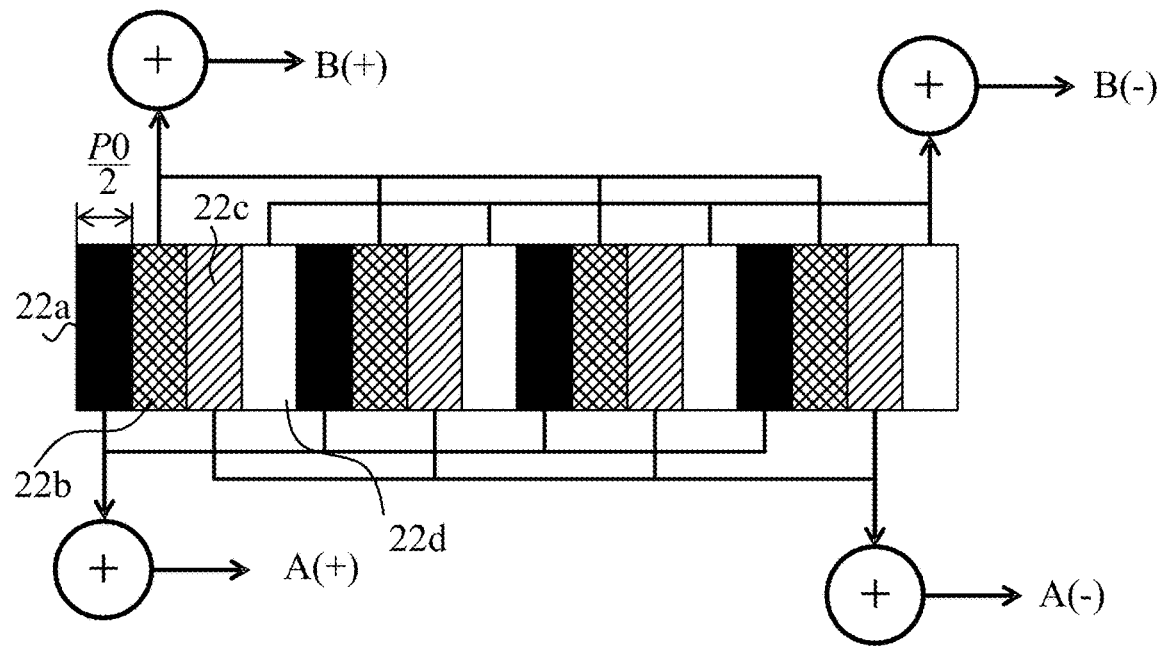
FIGS. 3A and 3B illustrate a configuration of a light receiver.
Figure 3B:
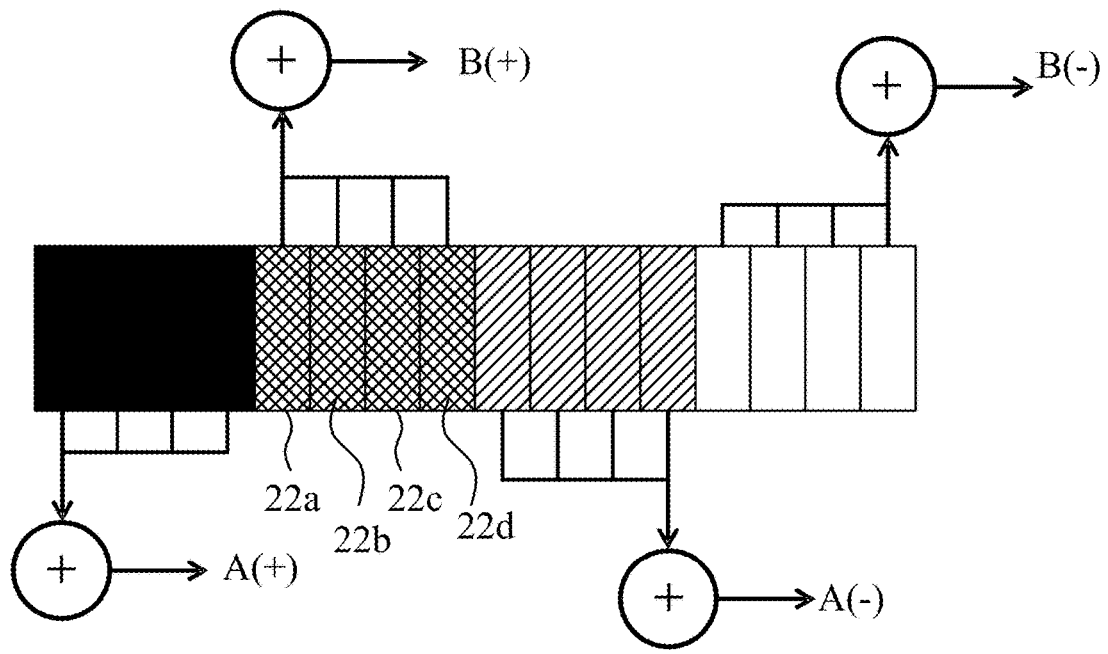

FIGS. 3A and 3B illustrate a configuration of the light receiver 22. The light receiver 22 includes light receiving elements 22a, 22b, 22c, and 22d circularly along the longitudinal direction. When the detecting period of the light receiver 22 is the first detecting period P0, each of the light receiving elements 22a, 22b, 22c, and 22d outputs signals A(+), B(+), A(−), and B(−), respectively, as illustrated in FIG. 3A. When the detecting period of the light receiver 22 is the second detecting period 4·P0, a set of light receiving elements 22a, 22b, 22c, and 22d outputs signals A(+), B(+), A(−), and B(−), as illustrated in FIG. 3B. The sensor 20 generates two-phase pseudo signals A(=A(+)−A(−)) and B(=B(+)−B(−)) different from each other based on the signals A(+), B(+), A(−), and B(−).

Figure 2B:
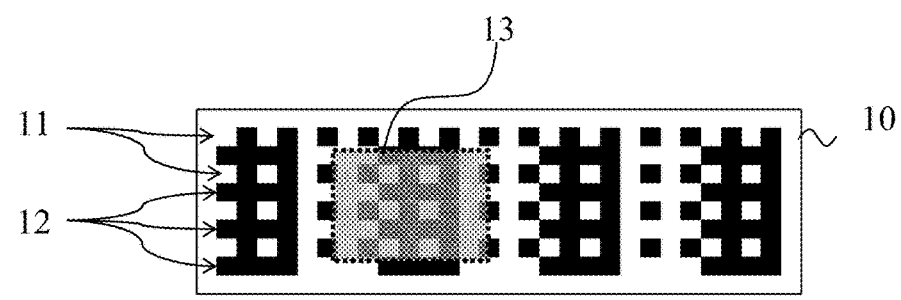

As illustrated in FIG. 2B, a read area 13 (a range of reflecting light emitted from the light source so that the light receiver 22 can receive the reflected light) on the track by the light receiver 22 contains a plurality of sets, each of which includes two periodic patterns alternately arranged in the width direction on the track. The light receiver 22 can read the first pattern when the detecting period is set to the first detecting period P0 or first detecting state. The light receiver 22 reads the first pattern 11, and outputs a two-phase pseudo sine wave signal (referred to as a first signal or a first two-phase signal) having a changing period corresponding to the first pitch P1 and a phase difference of about 90 degrees. The light receiver 22 can read the second pattern when the detecting period is set to the second detecting period 4·P0 or second detecting state. The light receiver 22 reads the second pattern 12, and outputs a two-phase pseudo sine wave signal (referred to as a second signal or a second two-phase signal) having a changing period corresponding to the second pitch P2 and a phase difference of about 90 degrees.

The position detector 30 includes an A/D converter 31, a phase detector (phase calculator) 32, and a displacement amount detector 33. The A/D converter samples the first and second two-phase signals as analogue signals output from the sensor 20 and converts them into digital signals. The phase detector 32 discretely detects the phases of the first and second two-phase signals in a time direction. The displacement amount detector 33 accumulates a difference between the two continuous phases detected by the phase detector 32, and detects a displacement amount.

The general controller 40 controls switching of the detecting period of the sensor 20 (an output of the detecting period switching signal from the position detector 30) and a position detection process of the position detector when a position detecting request signal is input from the system of the apparatus. The general controller 40 outputs information of the relative position of the movable member to the fixed member generated by the position detector 30 to the apparatus. The general controller 40 outputs a synchronizing signal for acquiring the first and second two-phase signals output from the sensor 20, to the position detector 30.

A description will now be given of the position detecting process performed by the position detector 30. The position detecting process is divided into a first process and a second process. The first process and the second process are executed in parallel. The first process detects (calculates) the relative displacement amount between the scale 10 and the sensor 20 by using one of the first and second two-phase signals taken from the light receiver 22 in which the detecting period is set to one detecting period. The second process detects (calculates) a first position of one of the scale 10 and the sensor 20 relative to the other of the scale 10 and the sensor 20 by using both of the first and second two-phase signals taken from the light receiver 22 in which the detecting period is set to each of the first and second detecting periods. Moreover, the second process detects (calculates) a second position of one of the scale 10 and the sensor 20 relative to the other of the scale 10 and the sensor 20 by using the first relative position and the relative displacement amount. The second process according to this embodiment calculates the relative position of the scale 10 to the sensor 20.

Figure 4:
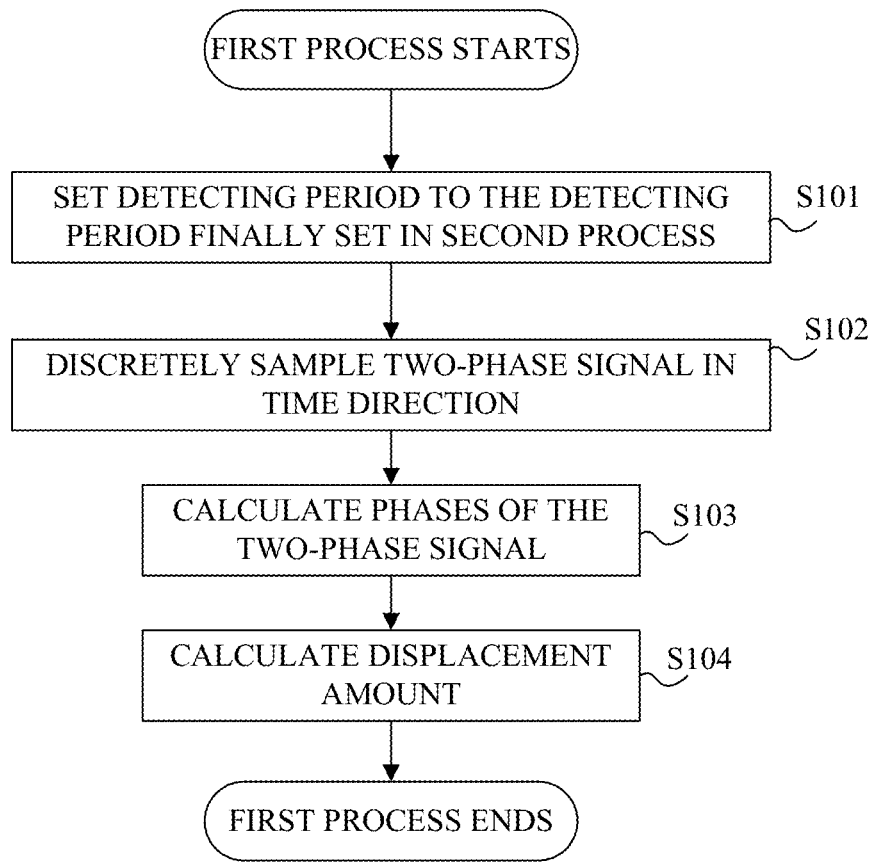
FIG. 4 is a flowchart illustrating a first process.

Referring now to FIG. 4, a description will be given of the first process. FIG. 4 is a flowchart of the first process. In this embodiment, the first process uses the first two-phase signal as one of the first and second two-phase signals and calculates the relative displacement amount between the scale 10 and the sensor 20.

In the step S101, the detecting period in the light receiver 22 is set to the detecting period finally set in the second process. In this embodiment, the detecting process in the light receiver 22 is set to the first detecting period P0. In other words, the first process reads the first patter 11 (or generates the first two-phase signal), but does not read the second pattern (or generate the second two-phase signal). In addition, after the detecting period in the sensor 20 is switched, a relatively long time is necessary to obtain the stable two-phase signal from the light receiver 22. The first process can be smoothly executed by maintaining the detecting period in the light receiver 22 after the second process.

In the step S102, the A/D converter 31 samples the first two-phase signal acquired from the sensor 20 discretely in the time direction, and outputs an acquired digital signal to the phase detector 32.

In the step S103, the phase detector 32 calculates the phase by calculating the arc tangent of the digital signal acquired from the A/D converter 31 according to the sampling of the A/D converter 31. Since the two-phase signals include a sine wave signal and a cosine wave signal, the phase can be obtained by the arc tangent calculation. The calculated phase is output to the displacement amount detector 33. In the following description, an i-th detected phase will be expressed as $\theta\_i$ ($0 \le \theta\_i \le 2\pi$ [rad]).

In the step S104, the displacement amount detector 33 calculates the relative displacement amount between the scale 10 and the sensor 20 by using the phase acquired from the phase detector 32. Where the detecting period in the light receiver 22 is the first detecting period P0, the phase changes relative to the relative displacement amount P0 with a ratio of 2n when a relative displacement occurs in the longitudinal direction. Therefore, the relative displacement amount can be calculated by accumulating the phase changing amount.

However, the phase does not continuously change and increases or decreases by $2\pi$, where the phase changes in a decreasing direction from 0 and where the phase changes in an increasing direction exceeding $2\pi$. Accordingly, a relative displacement amount x_i is calculated with the following expression (1) based on this fact, where x_0=0, and $\theta\_0=0$.

$$x\_i = \begin{cases} x\_\{i-1\} + \theta\_i - \theta\_\{i-1\} + 2\pi & (\theta\_i - \theta\_\{i-1\} < -\pi) \\ x\_\{i-1\} + \theta\_i - \theta\_\{i-1\} - 2\pi & (\theta\_i - \theta\_\{i-1\} \ge -\pi) \\ x\_\{i-1\} + \theta\_i - \theta\_\{i-1\} & \text{(in other cases)} \end{cases} \quad (1)$$

Figure 5:
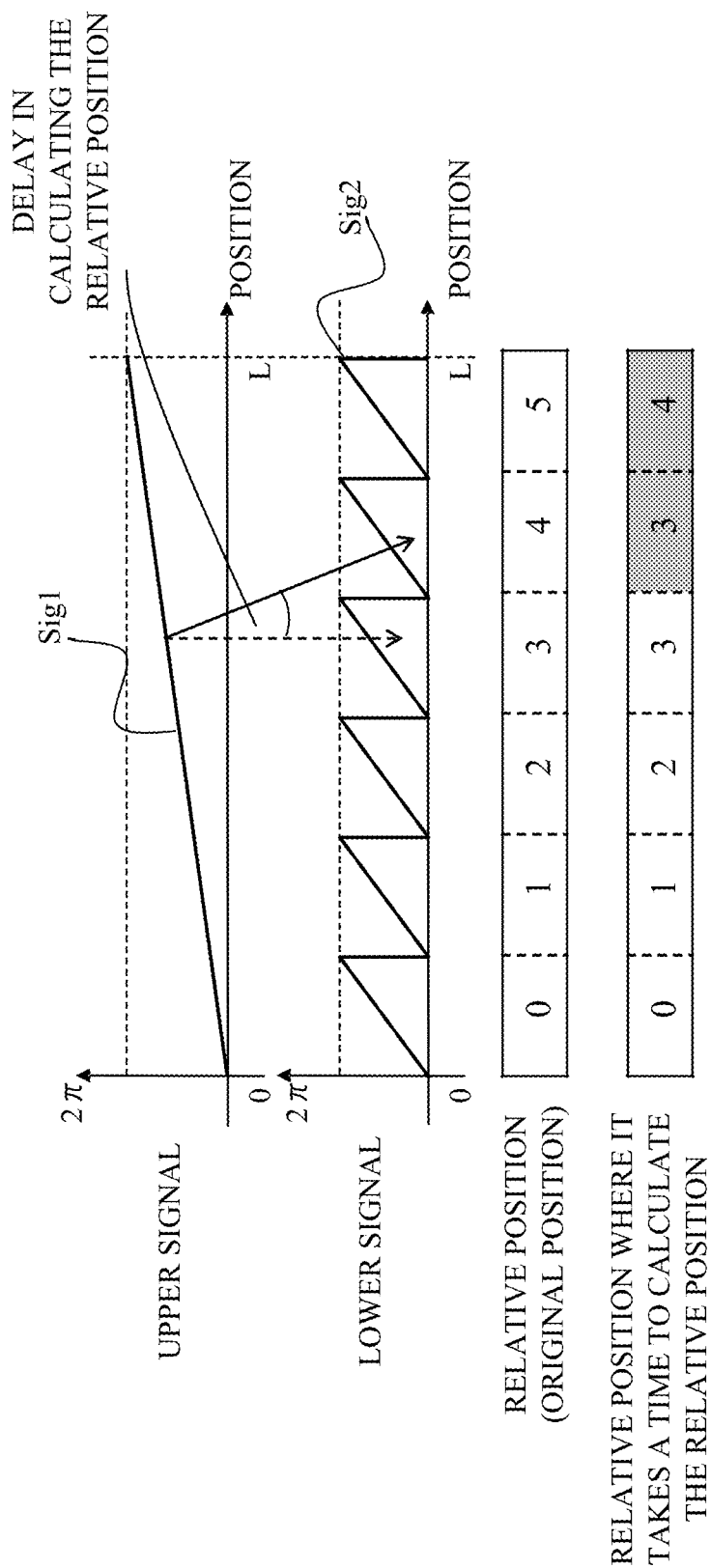
FIG. 5 is a view for explaining that a relative position shifts when a calculating time period for the relative position is longer than a predetermined time period.

Next follows a description of the second process. FIG. 5 is a view for explaining that the relative position shifts where a calculating time period of the relative position is longer than a predetermined time period. An upper signal (Sig1) is a signal generated by the sensor 20 where the detecting period in the light receiver 22 is the second detecting period 4·P0, and a lower signal (Sig2) is a signal generated by the sensor 20 where the detecting period in the light receiver 22 is the first detecting period P0. Where the calculating time period of the relative position is longer than the predetermined time period, the relative position that is originally 4 is 3, as illustrated in FIG. 5. In other words, a shift occurs relative to the original relative position.

Figure 6:
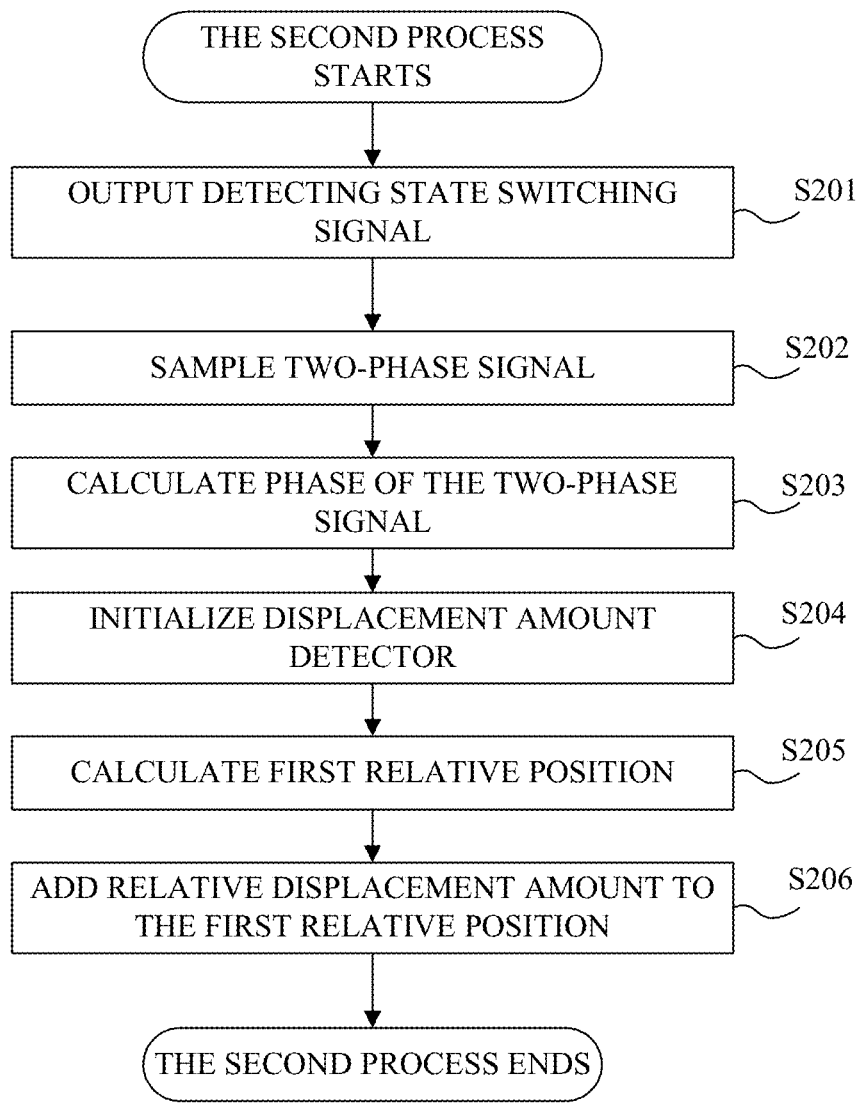
FIG. 6 is a flowchart illustrating a second process according to the first embodiment.
Figure 7:
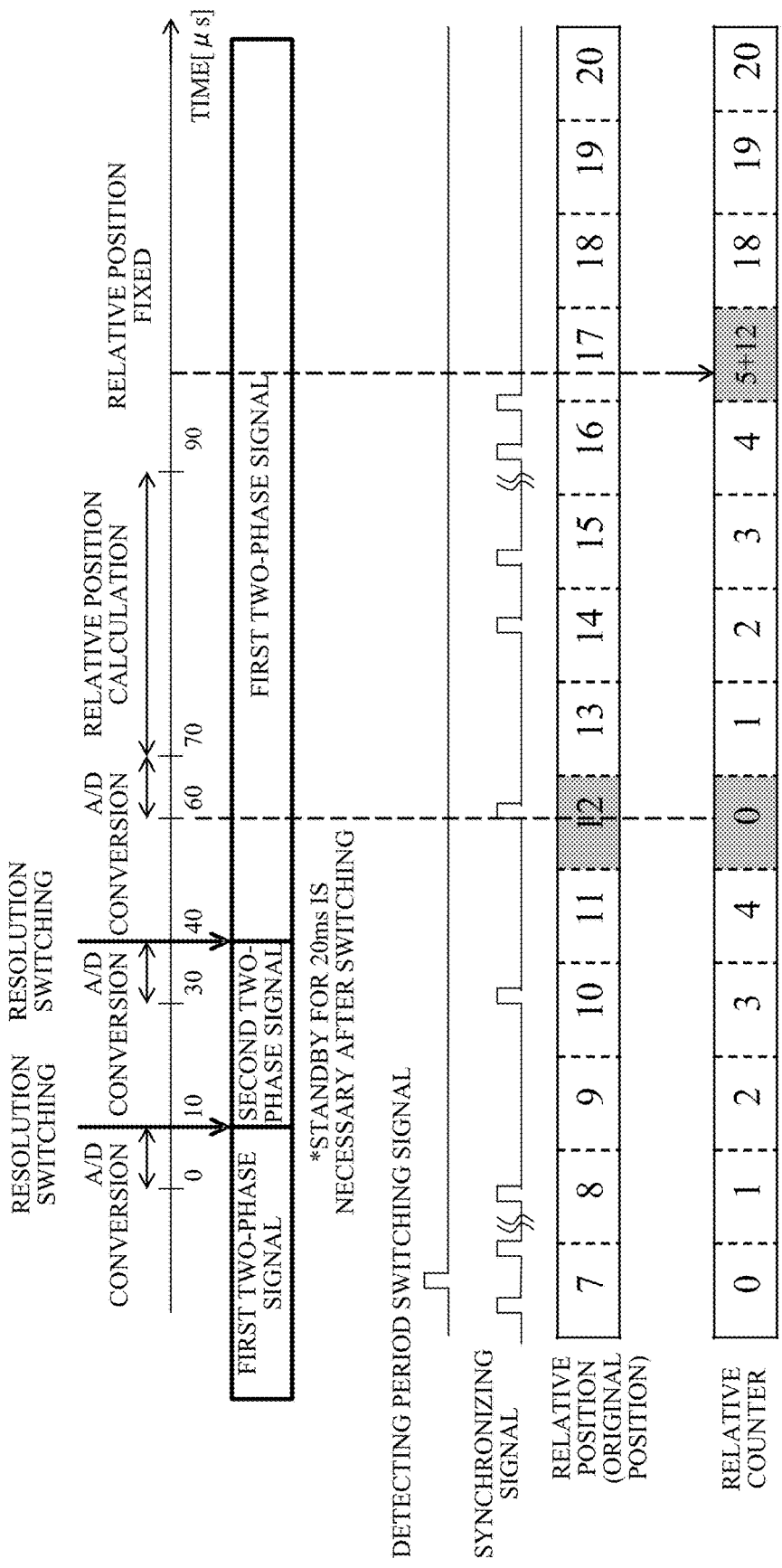
FIG. 7 illustrates an operational sequence of a general controller according to the first embodiment.

Accordingly, this embodiment executes the second process while the first process is executed. FIG. 6 is a flowchart of the second process according to this embodiment. FIG. 7 is a view illustrating an operational sequence of the general controller 40 according to this embodiment.

In the step S201, the general controller 40 stands by until a reference phase is settled when a synchronizing signal is generated just before the general controller 40 acquires the position detecting request signal when the position detecting request signal is input from the system in the apparatus. After the reference phase is settled, the general controller 40 instructs the position detector 30 to output the detecting state switching signal to the sensor 20. The detecting period in the light receiver 22 is switched to the first detecting period P0 according to the detecting state switching signal. Thereby, the sensor 20 outputs the first two-phase signal corresponding to the first pattern 11.

In the step S202, the A/D converter 31 samples the first two-phase signal. After the first two-phase signal is sampled, the detecting period in the light receiver 22 is switched to the second detecting period 4·P0. Thereby, the sensor 20 outputs the second two-phase signal corresponding to the second pattern 12. The A/D converter 31 samples the second two-phase signal. After the second two-phase signal is sampled, the detecting period in the light receiver 22 is switched to the first detecting period P0. Thereby, the sensor 20 outputs the first two-phase signal corresponding to the first pattern 11. The A/D converter 31 samples the first two-phase signal.

Thus, this embodiment performs sampling three times in order of the first two-phase signal, the second two-phase signal, and the first two-phase signal. The A/D converter 31 outputs the three sets of two-phase signals converted into the digital signals to the phase detector 32. The two-phase signal is sampled at regular intervals. In the following description, the initial first two-phase signal is sampled at time 0, the next second two-phase signal is sampled at time t, and the final first two-phase signal is sampled at time 2t.

In the step S203, the phase detector 32 calculates the phase of each set of two-phase signals by the arc tangent calculation to the three sets of two-phase signals. Since the two-phase signals include the sine wave signal and the cosine wave signal, the phase is calculated by the arc tangent calculation. In the following description, a phase of the initial first two-phase signal will be referred to as $\theta_{P1\_1}$, a phase of the second two-phase signal will be referred to as $\theta_{P2}$, and a phase of the final first two-phase signal will be referred to as $\theta_{P1\_2}$. The phase is expressed by a range from 0 inclusive to $2\pi$ non-inclusive, and uniquely determined in one pitch (period or cycle). Thus, the phase represents a position in one pitch.

In the step S204, as illustrated in FIG. 7, the displacement amount detector 33 (a relative counter in FIG. 7) is initialized.

In the step S205, the displacement amount detector 33 calculates the first relative position. The displacement amount detector 33 calculates the relative displacement amount in the first process in parallel to the calculation of the first relative position.

In the step S206, the displacement detector 33 calculates the second relative position by adding the relative displacement amount when the first relative position is settled, to the first relative position calculated in the step S205.

This embodiment executes the second process while the first process is executed, and can highly accurately calculate the relative position.

A description will now be given of a concrete calculating method of the relative position. Since the three phases $\theta_{P1\_1}$, $\theta_{P2}$, and $\theta_{P1\_2}$ are sampled at different times, where the scale 10 and the sensor 20 move relative to each other, the three phases correspond to positions that are different from one another. Accordingly, this embodiment calculates a position at the time 2t as the relative position.

Both of the phases $\theta_{P1\_1}$ and $\theta_{P1\_2}$ are phases of the first two-phase signals corresponding to the first pattern 11, and have the sampling times of 0 and 2t. Thus, the relative moving speed between the scale 10 and the sensor 20 can be estimated based on the change amounts of the phases $\theta_{P1\_1}$ and $\theta_{P1\_2}$ and the time variation amounts. Where u is the relative moving speed, u is calculated by the following expression (2).

$$u = \frac{P_1 \cdot \frac{(\theta_{P1\_2} - \theta_{P1\_1})}{2\pi}}{2t} \quad (2)$$

Since the sampling time of the phase $\theta_{P2}$ is t, where $\theta_{P2\_2}$ is the phase of the second two-phase signal corresponding to the second pattern 12 at time 2t, the phase $\theta_{P2\text{-}2}$ can be calculated by adding the change amount for a time period t with the relative moving speed u to the phase $\theta_{P2}$ as in the following expression (3).

$$\theta_{P2\_2} = \theta_{P2} + \frac{2\pi u t}{P_2} \quad (3)$$
$$= \theta_{P2} + (\theta_{P1\_2} - \theta_{P1\_1}) \cdot \frac{P_1}{P_2} \cdot \frac{1}{2}$$

The relative position is calculated with the thus obtained two phases $\theta_{P1\_1}$ and $\theta_{P1\_2}$ at time 2t.

Initially, the phases of 80 periods is generated by quadrupling the phase $\theta_{P2\_2}$ of the second two-phase signal corresponding to the second pattern 12 with 20 periods in the overall pattern length. Then, when a difference (phase difference) between the phase with the 80 periods and the phase $\theta_{P1\_2}$ in the two-phase signal corresponding to the first pattern 11 with 79 periods in the overall pattern length is calculated, the phase difference is one period in the overall pattern length. One period in the overall pattern length expresses the relative position. Accordingly, $\theta_{v1}$ as this phase difference can be expressed by the following expression (4), where MOD(x, y) is a residue, x is a dividend, and y is a divisor.

$$\theta_{v1} = \text{MOD}(4 \cdot \theta_{P2\_2} - \theta_{P1\_2}, 2\pi) \quad (4)$$

While the phase difference $\theta_{v1}$ denotes the relative position, use of the phases $\theta_{P1\_1}$ and $\theta_{P1\_2}$ provides a higher accuracy in one period than use of the phase difference $\theta_{v1}$. Accordingly, a relative position calculated with the phase difference $\theta_{v1}$ and the phases $\theta_{P1\_2}$, and $\theta_{P2\_2}$ is more accurate than a relative position calculated with the phase difference $\theta_{v1}$.

Figure 8A:
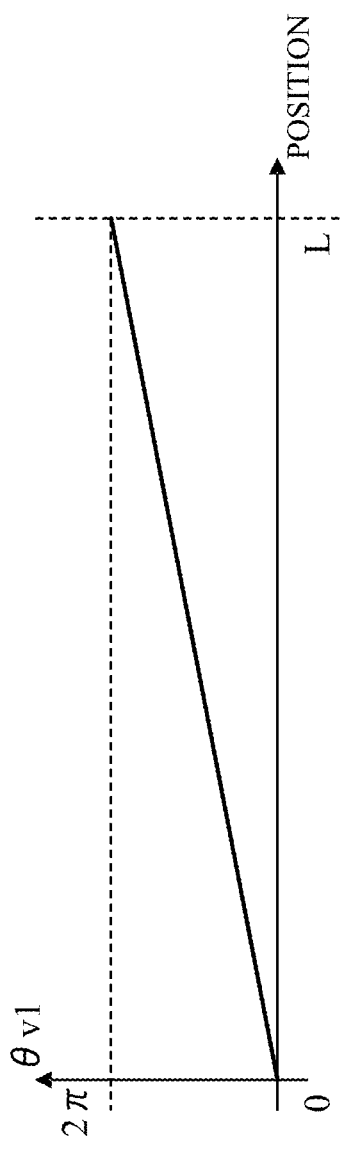
FIGS. 8A, 8B, and 8C are relational views between a position and a variable in the encoder according to the first embodiment.
Figure 8B:
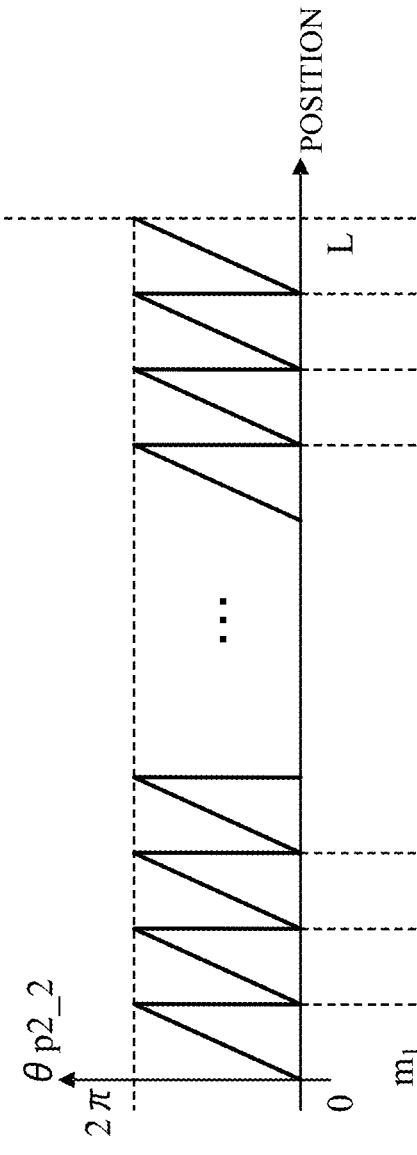
Figure 8C:
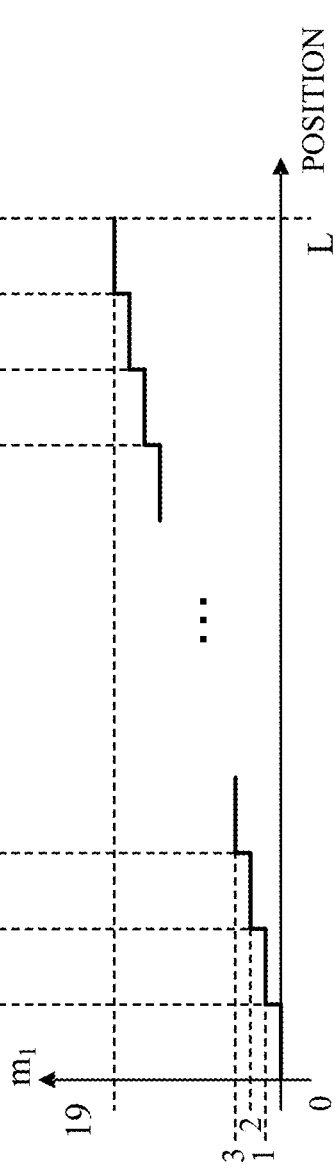

Since the second pattern 12 contains 20 periods in the overall pattern length, the phase $\theta_{P2\_2}$ changes 20 times from 0 to $2\pi$ in the overall pattern length. On the other hand, since the phase difference $\theta_{v1}$ changes once from 0 to $2\pi$ in the overall pattern length, a phase change amount per unit change amount is 1/20 as long as the phase $\theta_{P2\_2}$. Accordingly, the number of periods is calculated for the phase $\theta_{P2\_2}$ from the predetermined reference position based on the phase difference $\theta_{v1}$ and the phase $\theta_{P2\_2}$, and the relative position is calculated with the accuracy of the phase $\theta_{P2\_2}$.

Where m1 is the number of periods of the phase $\theta_{P2\_2}$, a relationship among the phase difference $\theta_{v1}$, the phase $\theta_{P2\_2}$, and the number of periods m1 is expressed as illustrated in FIGS. 8A, 8B, and 8C, where L is the overall pattern length.

Moreover, $\theta_1$ as a relative position calculated with the accuracy of the phase $\theta_{P2\_2}$ can be expressed by the following expressions (5) and (6) by using the number of periods m1 and the phase $\theta_{P2\_2}$, where ROUND(x) is rounding x into an integer value.

$$m_1 = \text{ROUND}\left(\frac{20 \cdot \theta_{v1} - \theta_{P2\_2}}{2\pi}\right) \quad (5)$$

$$\theta_1 = \frac{2\pi m_1 + \theta_{P2\_2}}{20} \quad (6)$$

Next, the first relative position $\theta_2$ is similarly calculated with the accuracy of the phase $\theta_{P2}$ based on the calculated relative position $\theta_1$ and the phase $\theta_{P1\_2}$. At this time, since the overall pattern length contains 79 periods of the first pattern 11, the phase $\theta_2$ is expressed by the following expressions (7) and (8) where $m_2$ is the number of periods of the phase $\theta_{P1\_2}$.

$$m_2 = \text{ROUND}\left(\frac{79 \cdot \theta_1 - \theta_{P1\_2}}{2\pi}\right) \quad (7)$$

$$\theta_2 = \frac{2\pi m_2 + \theta_{P1\_2}}{79} \quad (8)$$

The displacement amount detector 33 calculates the second relative position $\theta_3$ based on the first relative position $\theta_2$ and the phase $\theta_{P1\_3}$ calculated in the first process and the following expressions (9) and (10). The phase $\theta_{P1\_3}$ corresponds to an $m_3$-th period.

$$m_3 = \text{ROUND}\left(\frac{79 \cdot \theta_2 - \theta_{P1\_3}}{2\pi}\right) \quad (9)$$

$$\theta_3 = \frac{2\pi m_3 + \theta_{P1\_3}}{79} \quad (10)$$

The displacement amount detector 33 outputs the thus calculated second relative position $\theta_3$ to the general controller 40. The general controller 40 outputs information of the second relative position $\theta_3$ to the system in the apparatus. Thus, the second process ends. Thereafter, the relative position of the movable member is continuously calculated by accumulating the relative displacement amount in the first process on the basis of the second relative position $\theta_3$ calculated in the second process.

As described above, this embodiment calculates the relative displacement amount in the first process and the relative position in the second process in parallel, and can highly precisely calculate the relative position, even where the calculating time period of the relative position is longer than the predetermined time period.

This embodiment discusses the information of the relative position in the movable member output to the system in the apparatus, but this is unnecessary where the encoder outputs the position for each constant time period.

While this embodiment discusses an optical encoder using reflected light from a periodic pattern in which the reflecting part and the nonreflecting part are alternately provided, this embodiment is applicable to an optical encoder using transmitting light from a periodic pattern in which a transmitting part and a non-transmitting part are alternately provided.

Figure 2C:
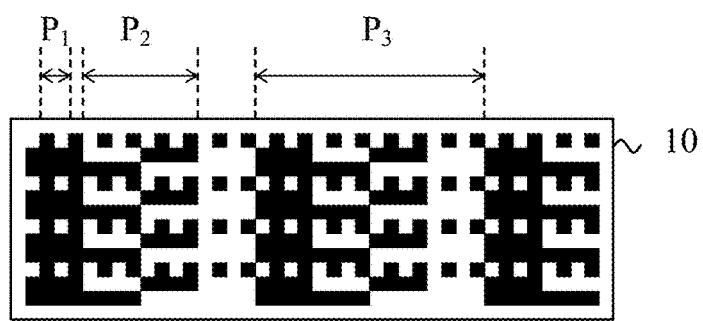

This embodiment discusses the encoder using two periodic patterns having periods (pitches) different from each other, but may provide three or more periodic patterns having different periods as illustrated in FIG. 2C. P1, P2, and P3 illustrate three periodic patterns having periods different from one another. A position detecting error may be relaxed or a position detecting length range may be extended by increasing the periodic pattern. In this case, a two-phase signal having the shortest period among three two-phase signals corresponding to three periodic patterns is set to the first two-phase signal, and all of the two other two-phase signals are set to the second two-phase signal. The two-phase signal having the longest period among three or more two-phase signals corresponding to the three or more periodic patterns is set to the second two-phase signal, and all of the two other two-phase signals are set to the second two-phase signal.

In this embodiment, the position detector 30 includes the A/D converter 31, but where another member, such as the sensor 20, has the A/D converter, the position detector 30 may include the A/D converter 31.

This embodiment sets the detecting period in the light receiver 22 to the first detecting period P0 at the end of the second process, but may set the second detecting period 4·P0. In this case, in the first process, the detecting period in the light receiver 22 is set to the second detecting period 4·P0. After the second process, the detecting period in the light receiver 22 is maintained and the first process can be smoothly executed.

Figure 1B:
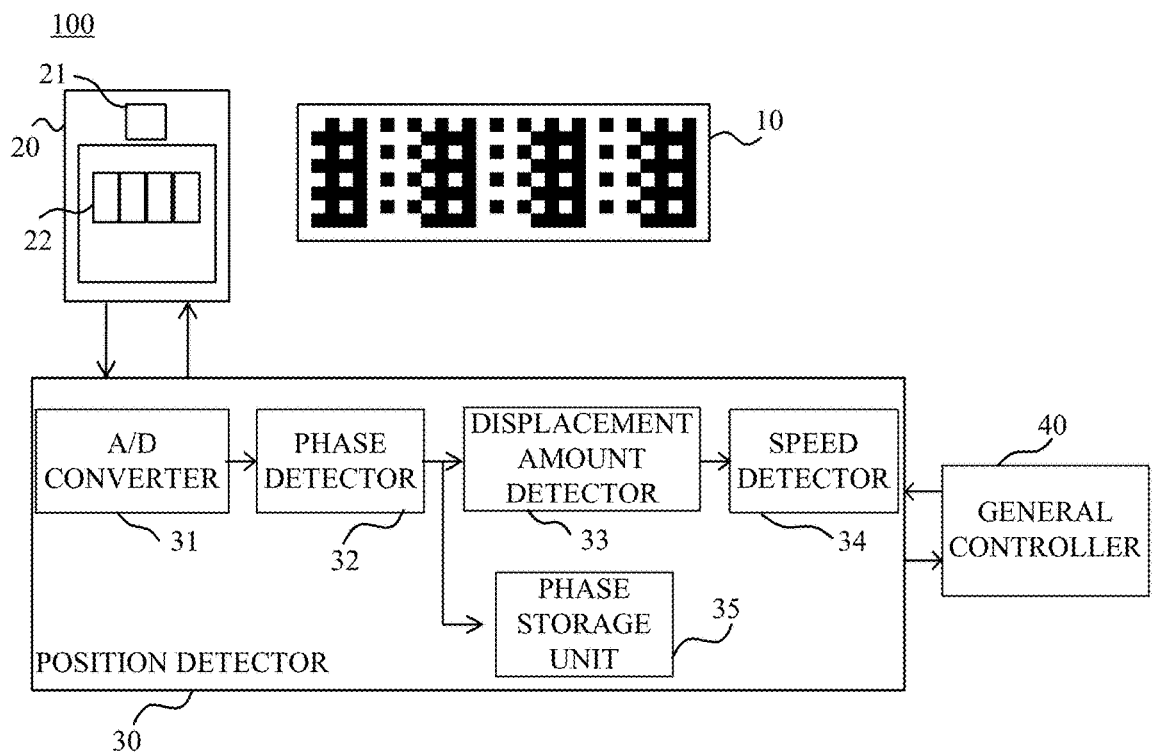

The position detector 30 may include at least one of the speed detector (speed calculator) 34 and the phase storage unit 35, as illustrated in FIG. 1B. The speed detector 34 calculates the relative moving speed between the scale 10 and the sensor 20. More specifically, sampling is performed three times in order of the first two-phase signal, the second two-phase signal, and the first two-phase signal, and the relative moving speed between the scale 10 and the sensor 20 can be estimated based on the changing amounts of the two first two-phase signals and the time variation amount. Hence, after the phase is corrected, the relative position can be detected. The phase storage unit 35 stores the phase calculated in the phase detector 32. Since the phase storage unit 35 stores the phase, the phase can be read at an arbitrary timing and the reliability can be improved.

Second Embodiment

This embodiment discusses the second process different from that in the first embodiment. The first embodiment initializes the displacement amount detector 33 before the relative position is calculated, but this embodiment stores the relative displacement amount when the displacement amount detector 33 starts calculating the relative position. The first process in this embodiment is similar to that in the first embodiment and a description thereof will be omitted. This embodiment discusses only the second process.

Figure 9:
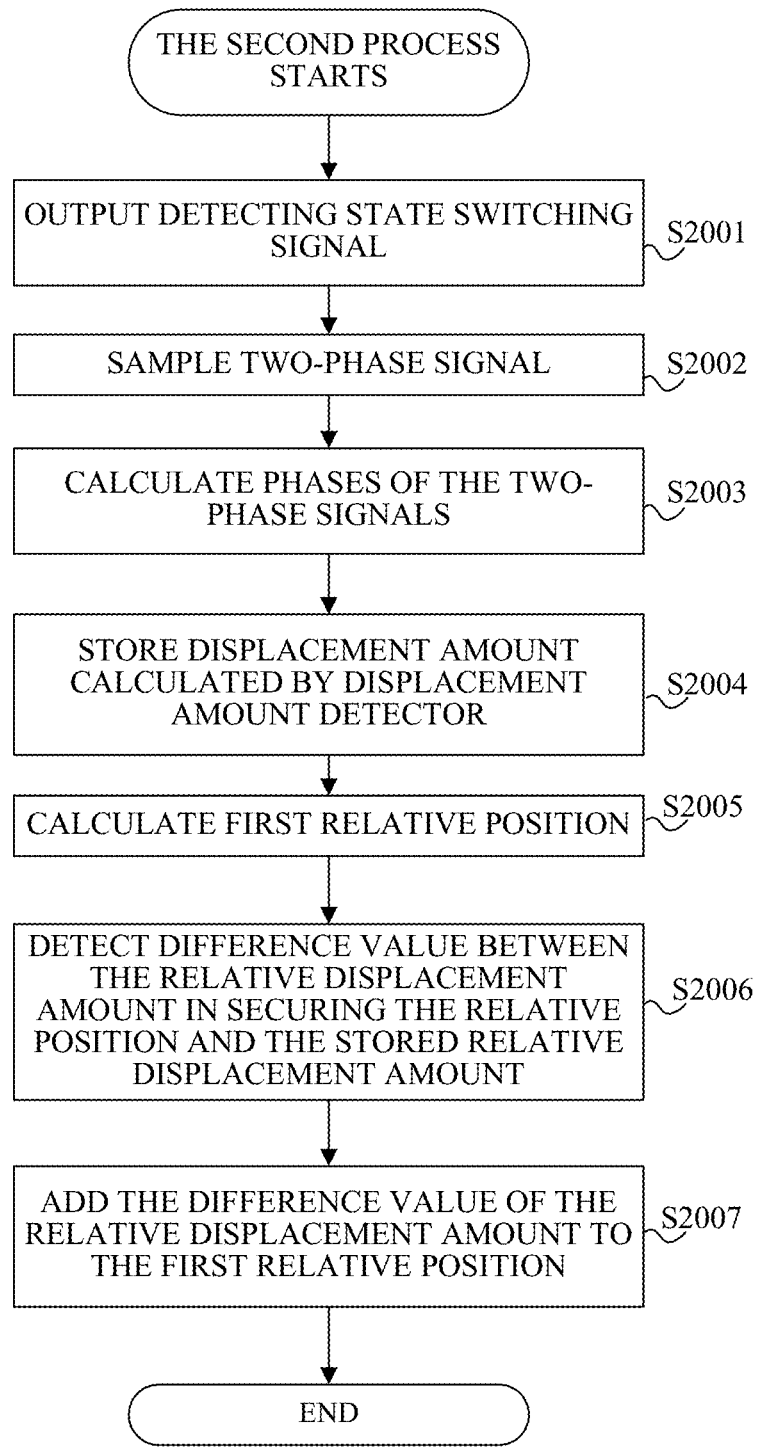
FIG. 9 is a flowchart illustrating a second process according to a second embodiment.
Figure 10:
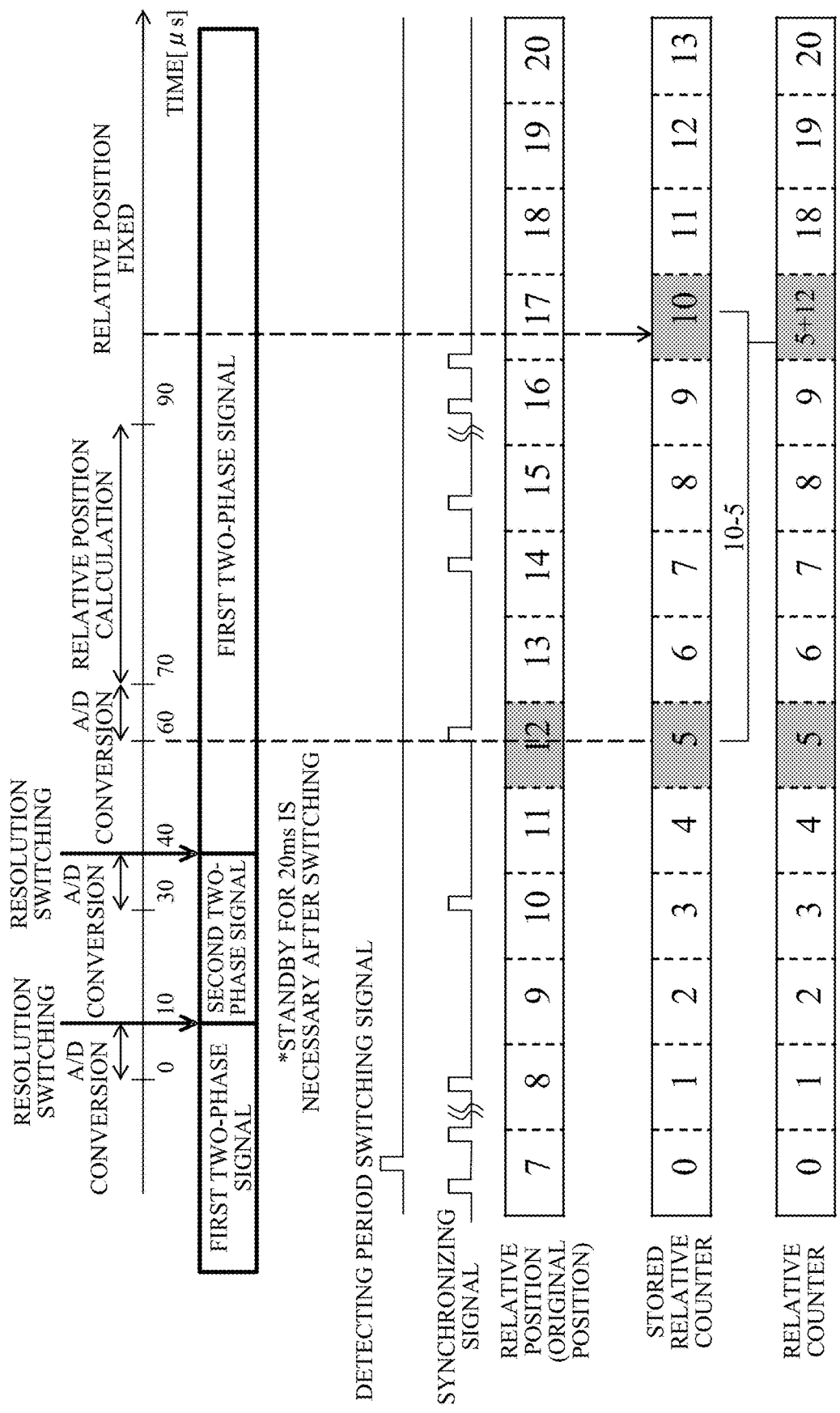
FIG. 10 illustrates an operational sequence of a general controller according to the second embodiment.

FIG. 9 is a flowchart of the second process according to this embodiment. FIG. 10 illustrates an operational sequence of the general controller 40 according to this embodiment.

Since the steps S2001 to S2003 are the same as the steps S201 to S203 in FIG. 6, a description thereof will be omitted.

In the step S2004, the displacement amount detector 33 stores a relative displacement amount when a calculation of the first relative position starts.

In the step S2005, the displacement amount detector 33 calculates the first relative position. The displacement amount detector 33 calculates the relative displacement amount in the first process in parallel to a calculation of the first relative position.

In the step S2006, the displacement amount detector 33 calculates a difference between the relative displacement amount stored in the step S2004 and a relative displacement amount when the first relative position is settled.

In the step S2007, the displacement amount detector 33 calculates a second relative position by adding the difference value calculated in the step S2006 to the first relative position calculated in the step S2005.

This embodiment can highly accurately calculate the relative position by executing the second process while executing the first process.

Third Embodiment

Figure 11:
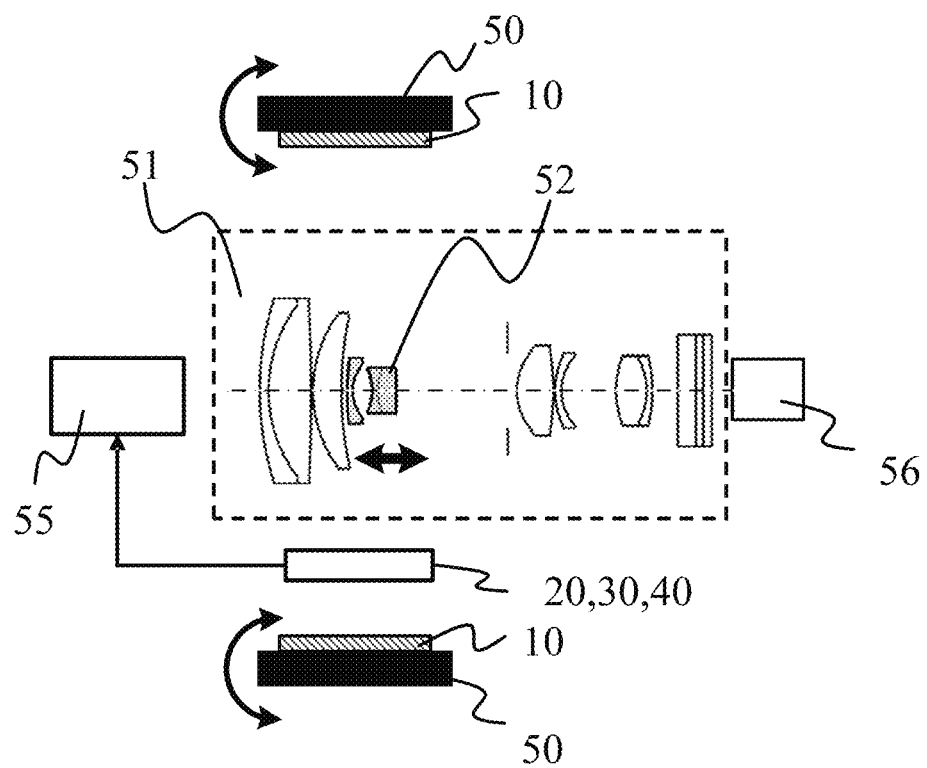
FIG. 11 is a block diagram illustrating a structure of an imaging apparatus according to a third embodiment.

FIG. 11 is a block diagram illustrating a configuration of an imaging apparatus (optical apparatus), such as a digital camera and a video camera, as one illustrative apparatus equipped with the encoder described in the first and second embodiments. In this imaging apparatus, the encoder is used to detect an absolute position of a movable lens in a lens barrel.

In FIG. 11, the encoder includes the scale 10, the sensor 20, the position detector 30, and the general controller 40. The scale 10 is attached to an inner circumference surface of a cam ring 50 having a cylindrical shape that rotates around the optical axis in the lens barrel. The cam ring 50 is rotated by an unillustrated actuator.

An imaging optical system 51 is housed in the lens barrel. The imaging optical system 51 includes a movable lens 52 (such as a magnification varying lens and a focus lens) that is movable in the optical axis direction by a cam formed the cam ring 50, as the cam ring 50 is rotated.

A CPU 55 controls the entire system in the imaging apparatus. An image sensor 56 includes a photoelectric conversion element, such as a CCD sensor and a CMOS sensor, and photoelectrically converts an object image formed by an imaging optical system 51.

As the cam ring 50 is rotated so as to move the movable lens 52, the encoder detects the absolute rotation position of the cam ring 50 (or the absolute position of the movable lens 52 in the optical axis direction), and outputs its information to the CPU 55.

The CPU 55 drives an actuator configured to rotate the cam ring 50 based on the absolute position information, and moves the movable lens 52 to a target position.

The encoder according to this embodiment is applicable to a variety of apparatuses, so as to detect a position of a printer head and a paper supply roller in a printer (optical apparatus), to detect a rotary position in a photosensitive drum in a copier (optical apparatus), and to detect a position of a robot arm, as well as the above imaging apparatus.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

The present invention can provide an encoder that can accurately calculate a relative position irrespective of a calculating time period.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-167775, filed on Aug. 30, 2016, which is hereby incorporated by reference herein in its entirety.

What is claimed is:

1. An encoder comprising:
a scale that has a first periodic pattern and a second periodic pattern that has a period longer than that of the first periodic pattern;
a detector movable relative to the scale, and switchable, by changing a combination of a plurality of read elements, between a first detecting state in which the detector reads the first periodic pattern and outputs a first signal having a changing period that depends on the first periodic pattern, and a second detecting state in which the detector reads the second periodic pattern and outputs a second signal having a changing period that depends on the second periodic pattern; and
a processor configured to execute a first process for calculating a relative displacement amount between the scale and the detector by using one of the first signal and the second signal obtained from the detector that is set to one of the first detecting state and the second detecting state, and a second process for calculating a relative position of one of the scale and the detector relative to the other of the scale and the detector by using both of the first signal and the second signal obtained from the detector that is set to each of the first detecting state and the second detecting state,
wherein the processor executes the second process while the processor executes the first process, the processor calculating a first relative position of the one to the other when the second process for calculating the relative position starts, and then calculating a second relative position of the one to the other based on the relative displacement amount and the first relative position.

2. The encoder according to claim 1, wherein the processor calculates the second relative position by adding to the first relative position a difference between the relative displacement amount between the scale and the detector when the calculation of the relative position starts and the relative displacement amount between the scale and the detector after the first relative position is calculated.

3. The encoder according to claim 1, further comprising a phase calculator configured to calculate a phase of each of the first signal and the second signal.

4. The encoder according to claim 3, further comprising a storage unit configured to store a phase calculated by the phase calculator.

5. The encoder according to claim 3, further comprising a speed calculator configured to calculate a relative moving speed between the scale and the detector based on the phase calculated by the phase calculator.

6. The encoder according to claim 1, wherein of the first detecting state and the second detecting state, a detecting state which is finally set in the second process is the same as that set in the first process.

7. The encoder according to claim 1, wherein the processor sets the first detecting state at an end of the second process.

8. The encoder according to claim 1, wherein the processor sets the first detecting state at an outset and at an end of the second process.

9. The encoder according to claim 1, wherein the processor, in the second process, calculates a relative moving speed between the scale and the detector by sampling the first signal and the second signal at a plurality of times, and calculates a phase of each of the first signal and the second signal, and calculates the first relative position based on the phase corrected with the relative moving speed and the times.

10. An apparatus comprising a movable member and an encoder configured to detect a position of the movable member,
wherein the encoder includes:
a scale that has a first periodic pattern and a second periodic pattern that has a period longer than that of the first periodic pattern;
a detector movable relative to the scale, and switchable, by changing a combination in a plurality of read element, between a first detecting state in which the detector reads the first periodic pattern and outputs a first signal having a changing period that depends on the first periodic pattern, and a second detecting state in which the detector reads the second periodic pattern and outputs a second signal having a changing period that depends on the second periodic pattern; and
a processor configured to execute a first process for calculating a relative displacement amount between the scale and the detector by using one of the first signal and the second signal obtained from the detector that is set to one of the first detecting state and the second detecting state, and a second process for calculating a relative position of one of the scale and the detector relative to the other of the scale and the detector by using both of the first signal and the second signal obtained from the detector that is set to each of the first detecting state and the second detecting state, wherein the processor executes the second process while the processor executes the first process, the processor calculating a first relative position of the one to the other when the second process for calculating the relative position starts, and then calculating a second relative position of the one to the other based on the relative displacement amount and the first relative position.

* * * * *